(12) United States Patent
Hakey et al.

(10) Patent No.: US 7,525,156 B2
(45) Date of Patent: Apr. 28, 2009

(54) SHALLOW TRENCH ISOLATION FILL BY LIQUID PHASE DEPOSITION OF SIO$_2$

(75) Inventors: Mark Charles Hakey, Fairfax, VT (US); Steven John Holmes, Guilderland, NY (US); David Vaclav Horak, Essex Junction, VT (US); Charles William Koburger, III, Delmar, NY (US); Peter H. Mitchell, Jericho, VT (US); Larry Alan Nesbit, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/760,477

(22) Filed: Jun. 8, 2007

(65) Prior Publication Data

US 2007/0228510 A1     Oct. 4, 2007

Related U.S. Application Data

(62) Division of application No. 10/732,953, filed on Dec. 11, 2003, now Pat. No. 7,273,794.

(51) Int. Cl.
*H01L 23/58* (2006.01)

(52) U.S. Cl. .............................. 257/347; 257/E23.112

(58) Field of Classification Search .................. 257/347
See application file for complete search history.

(56) References Cited

U.S. PATENT DOCUMENTS

| | | | |
|---|---|---|---|
| 4,693,781 A | 9/1987 | Leung et al. | |
| 5,453,395 A | 9/1995 | Lur | |
| 5,516,721 A * | 5/1996 | Galli et al. | 438/424 |
| 5,770,501 A | 6/1998 | Hong | |
| 5,849,643 A | 12/1998 | Gilmer et al. | |
| 5,851,900 A | 12/1998 | Chu et al. | |
| 5,851,921 A | 12/1998 | Gardner et al. | |
| 5,867,420 A | 2/1999 | Alsmeier | |
| 5,882,982 A | 3/1999 | Zheng et al. | |
| 5,939,765 A | 8/1999 | Zheng et al. | |
| 5,994,178 A | 11/1999 | Wu | |
| 5,998,255 A | 12/1999 | Kung et al. | |

(Continued)

OTHER PUBLICATIONS

Quirk et al., Semiconductor Manufacturing Technology, Prentice Hall, 2001, pp. 118-119.*

(Continued)

*Primary Examiner*—David A Zarneke
(74) *Attorney, Agent, or Firm*—Wood, Herron & Evans, LLP

(57) ABSTRACT

To isolate two active regions formed on a silicon-on-insulator (SOI) substrate, a shallow trench isolation region is filled with liquid phase deposited silicon dioxide (LPD-SiO$_2$) while avoiding covering the active areas with the oxide. By selectively depositing the oxide in this manner, the polishing needed to planarize the wafer is significantly reduced as compared to a chemical-vapor deposited oxide layer that covers the entire wafer surface. Additionally, the LPD-SiO$_2$ does not include the growth seams that CVD silicon dioxide does. Accordingly, the etch rate of the LPD-SiO$_2$ is uniform across its entire expanse thereby preventing cavities and other etching irregularities present in prior art shallow trench isolation regions in which the etch rate of growth seams exceeds that of the other oxide areas.

12 Claims, 2 Drawing Sheets

U.S. PATENT DOCUMENTS

| | | | |
|---|---|---|---|
| 6,010,948 A | 1/2000 | Yu et al. | |
| 6,015,739 A | 1/2000 | Gardner et al. | |
| 6,037,238 A | 3/2000 | Chang et al. | |
| 6,077,786 A * | 6/2000 | Chakravarti et al. | 438/695 |
| 6,100,131 A | 8/2000 | Alsmeier | |
| 6,107,158 A | 8/2000 | Zheng et al. | |
| 6,171,911 B1 | 1/2001 | Yu | |
| 6,207,531 B1 | 3/2001 | Pen-Liang | |
| 6,211,002 B1 * | 4/2001 | Wu | 438/223 |
| 6,221,767 B1 | 4/2001 | Hsu et al. | |
| 6,225,167 B1 | 5/2001 | Yu et al. | |
| 6,265,261 B1 | 7/2001 | Kim et al. | |
| 6,265,271 B1 | 7/2001 | Thei et al. | |
| 6,294,817 B1 | 9/2001 | Srinivasan et al. | |
| 6,303,483 B1 | 10/2001 | Kunikiyo | |
| 6,306,722 B1 | 10/2001 | Yang et al. | |
| 6,335,249 B1 | 1/2002 | Thei et al. | |
| 6,348,389 B1 | 2/2002 | Chou et al. | |
| 6,399,977 B1 | 6/2002 | Alsmeier | |
| 6,403,485 B1 | 6/2002 | Quek et al. | |
| 6,406,985 B1 | 6/2002 | Hsu | |
| 6,492,224 B1 | 12/2002 | Jao | |
| 6,511,884 B1 | 1/2003 | Quek et al. | |
| 6,511,887 B1 | 1/2003 | Yu et al. | |
| 6,541,382 B1 | 4/2003 | Cheng et al. | |
| 6,544,860 B1 | 4/2003 | Singh | |
| 6,579,778 B1 | 6/2003 | Tripsas et al. | |
| 6,664,580 B2 | 12/2003 | Jao | |
| 6,710,413 B2 | 3/2004 | Thei et al. | |
| 6,727,159 B2 | 4/2004 | Chen et al. | |
| 6,730,568 B2 | 5/2004 | Sohn | |
| 6,831,012 B2 | 12/2004 | Kang et al. | |
| 6,855,591 B2 | 2/2005 | Kim | |
| 6,878,578 B1 | 4/2005 | Twu et al. | |
| 6,911,369 B2 | 6/2005 | Lee et al. | |
| 6,953,727 B2 | 10/2005 | Hori | |
| 6,962,857 B1 | 11/2005 | Ngo et al. | |
| 6,967,130 B2 | 11/2005 | Chen et al. | |
| 6,991,991 B2 | 1/2006 | Cheng et al. | |
| 7,041,558 B2 | 5/2006 | You et al. | |
| 7,087,497 B2 | 8/2006 | Yuan et al. | |
| 7,125,783 B2 | 10/2006 | Lo et al. | |
| 7,151,022 B2 | 12/2006 | Kim | |
| 7,180,116 B2 | 2/2007 | Chiang et al. | |
| 7,238,588 B2 | 7/2007 | Xiang | |
| 7,268,048 B2 | 9/2007 | Goh et al. | |
| 7,273,794 B2 | 9/2007 | Hakey et al. | |
| 2002/0106865 A1 * | 8/2002 | Chen et al. | 438/424 |
| 2008/0040696 A1 | 2/2008 | Hakey et al. | |

OTHER PUBLICATIONS

Wolf et al, Silicon Processing for the VLSI Era, vol. 1 Process Technology Second Edition, (Lattice Press 2000) p. 435.

Zarneke, David A. (Examiner), US Patent and Trademark Office, Office Action issued in relation U.S. Appl. No. 12/112,549 dated Dec. 17, 2008 (7 pages).

* cited by examiner

SHALLOW TRENCH ISOLATION FILL BY LIQUID PHASE DEPOSITION OF SIO$_2$

CROSS-REFERENCE TO RELATED APPLICATIONS

This application is a divisional of application Ser. No. 10/732,953, filed Dec. 11, 2003, which is hereby incorporated by reference herein in its entirety.

FIELD OF THE INVENTION

The present invention relates to fabricating semiconductor devices and more particularly to shallow trench isolation techniques.

BACKGROUND OF THE INVENTION

Using current photolithography practices, a number of semiconductor devices can be formed on the same silicon substrate. One technique for isolating these different devices from one another involves the use of a shallow trench between two devices, or active areas, that is filled with an electrically-insulative material. Known as shallow trench isolation, a trench is formed that extends from a top material layer on a wafer to a buried oxide layer, for example, and the trench is then filled with an electrically-insulative material, such as oxide. In particular, chemical vapor deposition (CVD) is used to cover the entire wafer with the oxide material and then planarized.

This method of filling the trench with oxide introduces a number of problems. First, the oxide, typically silicon dioxide, must be planarized across the entire wafer to a level that coincides with the top of the trench. Through a planarizing process, such as chemical mechanical polishing (CMP), all the oxide must be completely removed from the active areas without over polishing either the active areas or the trenches. As wafer sizes have increased, uniform polishing over the entire wafer is difficult to accomplish and, as a result, some areas of the wafer have too much of the oxide removed while other areas have too little removed. Especially as wafer sizes have increased to 300 mm, "dishing", or over polishing of the oxide is a common occurrence.

Additionally, CVD deposition of oxide results in growth from the bottom and sides of the trench. Thus, three growing fronts exist within the trench as the oxide is being formed. When two growing fronts meet, a seam is formed that behaves differently during wet etching, such as with buffered hydrofluoric acid (BHF) or diluted hydrofluoric acid (DHF). When etched with a wet etching solution, the seams etch at a faster rate than the other portions of silicon dioxide. As a result, trenches, or cavities, are formed in the silicon dioxide along the seams. During later fabrication steps that deposit material on the wafer, these cavities can collect the deposited material resulting in unintended consequences. For example, deposition of polysilicon followed by a polysilicon etch step will result in polysilicon unintentionally remaining in some of the cavities along the seams in the silicon dioxide. Under these circumstances, if two gate conductors cross a common seam, then an electrical short could develop between the conductors.

FIG. 1 illustrates a silicon-on-insulator (SOI) wafer 100 with shallow trench isolation regions formed using the conventional methods just described. In this figure, a silicon substrate 102 supports a buried oxide layer 104 and a SOI layer 106. In four active areas 120, 122, 124, 126, a pad oxide layer 108 and pad nitride layer 110 cover the SOI layer 106. Three trenches are formed between the active areas 120, 122, 124, 126 and are filled with an electrically-insulative oxide such as silicon dioxide 112. Because the silicon dioxide 112 is thermally grown using a CVD process, the silicon dioxide 112 in each trench includes seams 114 where growth fronts met when the silicon dioxide 112 was being formed. Furthermore, FIG. 1 depicts the over and under polishing that occurs when a thick layer of silicon dioxide 112 must be planarized over the entire surface of the wafer 100. For example, the right-side of the wafer 100 shows that the planarization step removed silicon dioxide 112 from the trench while the left-side of the wafer 100 shows that some silicon dioxide 112 still remains on the pad nitride layer 110.

Accordingly, there remains a need within the field of semiconductor fabrication for a shallow trench isolation technique that minimizes the mechanical polishing needed to planarize the oxide layer and that utilizes an oxide layer that has a uniform etch rate.

SUMMARY OF THE INVENTION

Therefore, embodiments of the present invention involve filling a shallow trench isolation region with liquid phase deposited silicon dioxide (LPD-SiO$_2$) while avoiding covering active areas with the oxide. By selectively depositing the oxide in this manner, the polishing needed to planarize the wafer is significantly reduced as compared to a CVD oxide layer that covers the entire wafer surface. Additionally, the LPD-SiO$_2$ does not include the growth seams that CVD silicon dioxide does. Accordingly, the etch rate of the LPD-SiO$_2$ is uniform across its entire expanse thereby preventing cavities and other etching irregularities present in prior art shallow trench isolation regions in which the etch rate at the growth seams exceeds that of the other oxide areas.

One aspect of the present invention relates to a method of forming shallow trench isolation regions. In accordance with this aspect, a plurality of active regions are formed on a silicon substrate and a shallow trench isolation region is formed between two of the active regions. Silicon dioxide is selectively deposited within the shallow trench isolation region and not deposited on the two active regions.

Another aspect of the present invention relates to a semiconductor substrate on an SOI substrate that includes first and second active regions separated by a shallow trench isolation region. In particular, the shallow trench isolation region is filled with liquid-phase deposited silicon dioxide (LPD-SiO$_2$).

Yet another aspect of the present invention relates to a semiconductor device forming area on an SOI substrate that includes at least two active areas and a shallow trench isolation region between the two areas. This forming area also includes an electrically-insulative material filling the shallow trench isolation region, the electrically-insulative material comprised substantially of silicon dioxide and having a uniform etch rate when exposed to wet etching solution.

One additional aspect of the present invention relates to a method of forming shallow trench isolation regions. In accordance with this aspect, a plurality of active regions are formed on a silicon substrate and a shallow trench isolation region is formed between two of the active regions. Silicon dioxide is selectively deposited within the shallow trench isolation region by liquid phase deposition of the silicon dioxide.

DETAILED DESCRIPTION

Figure 1:
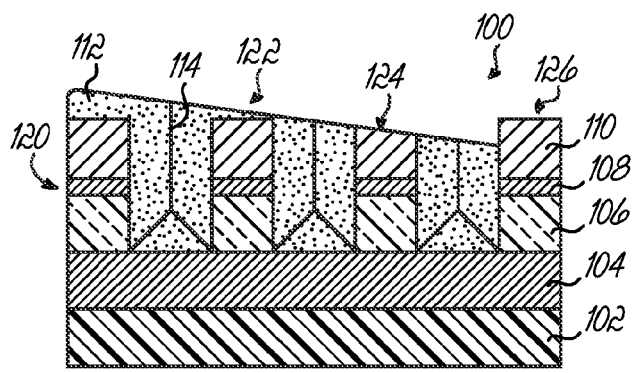
FIG. 1 illustrates a SOI wafer having shallow trench isolation regions formed using conventional fabrication methods.
Figure 2:
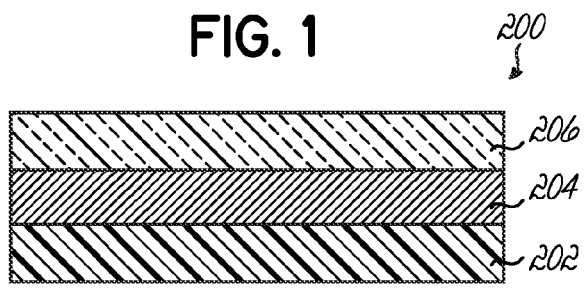
FIG. 2 illustrates an initial SOI wafer on which shallow trench isolation regions are formed according to an embodiment of the present invention.
Figure 3:
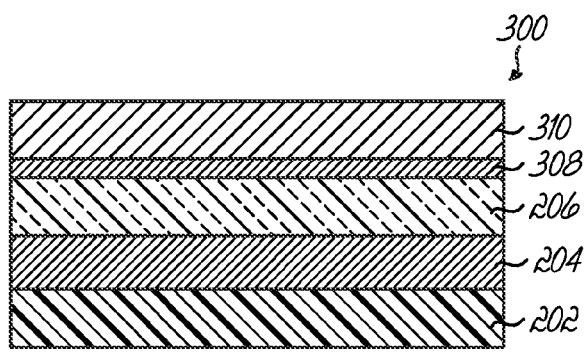
FIG. 3 illustrates the SOI wafer of FIG. 2 with a pad nitride layer and an optional pad oxide layer according to an embodiment of the present invention.

FIG. 2 illustrates a silicon-on-insulator (SOI) wafer that can be formed by a variety of conventional methods, such as SIMOX or wafer bonding and etch back. The wafer 200 includes a silicon or other semiconductor substrate 202, a buried oxide (BOX) layer 204, and a silicon on insulator (SOI) layer 206. To continue the process, and referring to FIG. 3, a pad oxide layer 308 and a pad nitride layer 310 are formed over the SOI layer 206. The pad oxide layer 308 is typically silicon dioxide and is approximately between 2-10 nm in thickness. Some embodiments of the present invention omit the pad oxide layer 308 such as when a buffer between the pad nitride layer 310 and the silicon 206 is not needed. For example, as the thickness of the pad nitride layer 310 is reduced, it causes less damage when formed over the silicon 206. In some instances, therefore, the pad nitride layer 310 can be formed directly on the silicon 206 without the protection of the pad oxide layer 308. The pad nitride layer is typically $Si_3N_4$ and is approximately between 10-150 nm thick.

Figure 4:
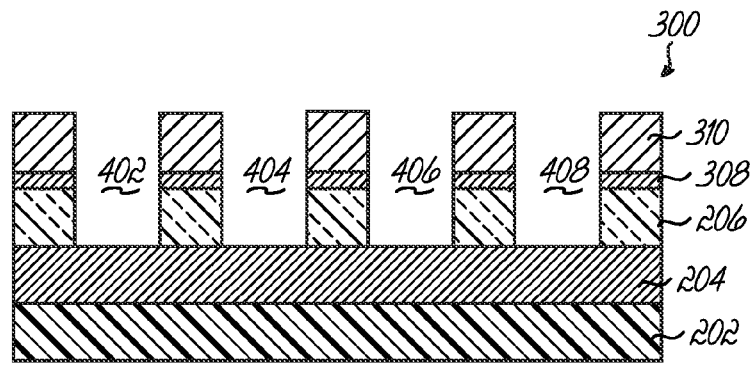
FIG. 4 illustrates the SOI wafer of FIG. 3 with a plurality of shallow isolation trenches.

Using standard photolithographic and etching techniques, a photo resist pattern can be formed on the top of the pad nitride layer 310 so as to form shallow isolation trenches down to the BOX layer 204. As shown in FIG. 4, the trenches 402, 404, 406, and 408 separate a number of active areas in which separate devices, such as transistors, can be formed. To create the trenches, a photo resist layer (not shown) is patterned on the pad nitride layer 310 and etching of the pad nitride layer 310 and pad oxide layer 308 is performed using the pattern. The photo resist can then be stripped and the resulting pattern of the pad nitride layer 310 is typically used to control the etch area of the SOI layer 206. As one alternative, the photo resist pattern can be used as the guide for etching all three layers, as well.

Figure 5:
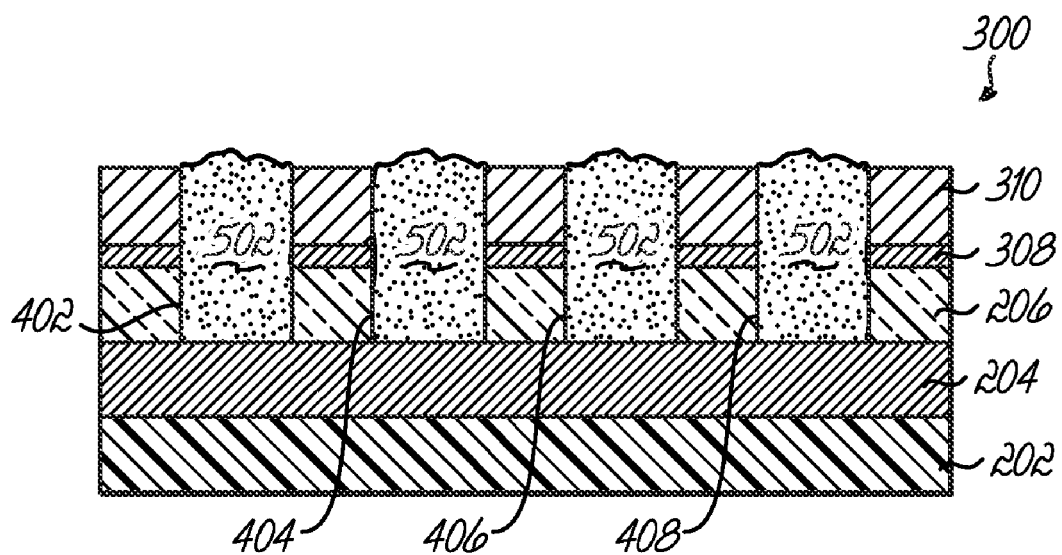
FIG. 5 illustrates the SOI wafer of FIG. 4 with the plurality of shallow isolation trenches filled with an electrically insulative material in accordance with one embodiment of the present invention.

At this point, the sidewalls of the trenches 402-408 can be cleaned to reduce or eliminate native oxide along the exposed sidewalls of the SOI layer 208. This cleaning step can be accomplished by a hydrogen peroxide based cleaning step or other RCA cleaning methods in combination with DHF and/or BHF cleans known to a skilled artisan. After being cleaned, the trenches 402-408 are ready to be filled. FIG. 5 depicts the SOI wafer 300 with its trenches 402-408 filled with oxide 502. In particular the oxide is formed by depositing silicon dioxide by means of Liquid Phase Deposition. This deposition occurs in such a manner that the oxide nucleates on, and grows from, the exposed surface of the BOX layer 204. Thus, liquid-phase deposited silicon dioxide ($LPD-SiO_2$) differs in physical structure than silicon dioxide deposited via a conventional CVD process.

The formation of silicon dioxide 502 is localized to the trenches and does not cover the active areas 504-512. Furthermore, the silicon dioxide 502 in each trench is formed without seams caused by the intersection of different growth fronts and, therefore, has a uniform etch rate across its entire surface. As shown in FIG. 5, the liquid phase deposited silicon dioxide 502 ($LPD-SiO_2$) overfills the trenches and extends above the pad nitride layer 310 by approximately 10 to 100 nm, although as much as 500 nm is contemplated.

Figure 6:
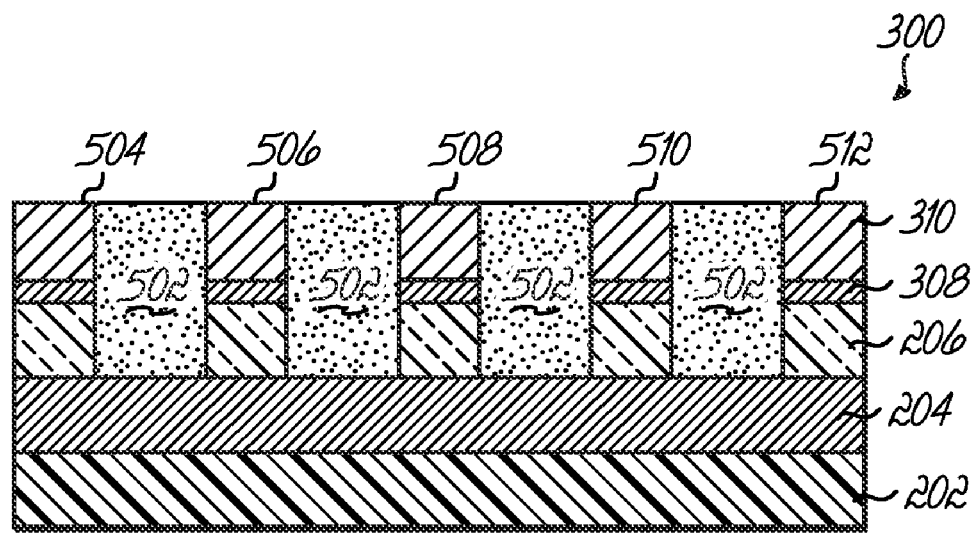
FIG. 6 illustrates the SOI wafer of FIG. 5 once the electrically insulative material within the trenches has been planarized.

Generally, $LPD-SiO_2$ tends to be less dense than thermally grown silicon dioxide, such as that resulting from a CVD process. Accordingly, a high temperature anneal or oxidation, such as at 800-1200° C., can be performed to densify the $LPD-SiO_2$ 502 so that it is more characteristic of thermally grown silicon dioxide. The annealing step can be performed using rapid thermal annealing that lasts for seconds to minutes or a slow furnace annealing that can last for hours. In either case, the ambient atmosphere is preferably inert to slightly oxidizing. This annealing step can be performed before or after the $LPD-SiO_2$ 502 is planarized to the level of the pad nitride layer 310 as shown in FIG. 6. Chemical mechanical polishing (CMP) can be used to planarize the $LPD-SiO_2$ 502. However, only a few areas of oxide 502 (i.e., just the trenches) need to been planarized which reduces the amount of polishing, and the resulting time, needed to planarize the wafer 200.

Also, because the CMP of the oxide 502 is reduced, less protection is needed over the active areas as compared to planarizing a CVD deposited oxide layer over an entire wafer as was performed historically. Thus, the thickness of the pad nitride layer 310 can be reduced as compared to conventional methods. Reducing the thickness of the pad nitride layer 310 is beneficial because it reduces the time needed to deposit the layer 310 and remove the layer 310; both of which are slow processes. In the past protective pad nitride layers have commonly exceeded 200 nm and more.

Once the trenches are filled and planarized (as shown in FIG. 6), conventional semiconductor fabrication processes can continue to form a variety of devices within the active areas on the SOI wafer 300. For example, the pad nitride layer 310, and possibly the pad oxide layer 308, would be stripped off and well implantation would occur to form source/drain regions over which a gate could be constructed. Additionally, if the optional pad oxide layer 308 was omitted during fabrication, a sacrificial oxide layer can be grown over the exposed SOI regions before additional manufacturing steps are performed.

Various modifications may be made to the illustrated embodiments without departing from the spirit and scope of the invention. Therefore, the invention lies in the claims hereinafter appended.

What is claimed is:

1. A semiconductor device structure formed using a silicon-on-insulator layer composed of a semiconductor material and a buried oxide layer carrying the silicon-on-insulator layer, the semiconductor device structure comprising:
    a first active region containing the semiconductor material;
    a second active region containing the semiconductor material; and
    a shallow trench isolation region in the silicon-on-insulator layer with sidewalls extending to the buried oxide layer to separate the first and second active regions, the shallow trench isolation region composed of liquid-phase deposited silicon dioxide that is free of growth seams,
    wherein the first and second active regions each have sidewalls bordering the sidewalls of the shallow trench isolation region, the sidewalls of the first and second active regions being substantially free of oxidized semiconductor material from the silicon-on-insulator layer.

2. The semiconductor device structure of claim 1 further comprising:
a pad oxide layer on the first and second active regions.

3. The semiconductor device structure of claim 2 wherein the pad oxide layer has a thickness between approximately 2 nm and approximately 10 nm.

4. The semiconductor device structure of claim 1 further comprising:
a pad nitride layer on the first and second active regions.

5. The semiconductor device structure of claim 4 wherein the pad nitride layer has a thickness between approximately 10 nm and approximately 150 nm.

6. The semiconductor device structure of claim 1 wherein the liquid-phase deposited silicon dioxide has a density similar to thermally grown silicon dioxide.

7. A semiconductor device structure formed using a silicon-on-insulator layer composed of a semiconductor material and a buried oxide layer carrying the silicon-on-insulator layer, the semiconductor device structure comprising:
a first active region containing the semiconductor material;
a second active region containing the semiconductor material; and
a shallow trench isolation region in the silicon-on-insulator layer with sidewalls extending to the buried oxide layer to separate the first and second active regions, the shallow trench isolation region composed of liquid-phase deposited silicon dioxide configured to have a uniform etch rate when exposed to wet etching solution,
wherein the first and second active regions each have sidewalls bordering the sidewalls of the shallow trench isolation region, the sidewalls of the first and second active regions being substantially free of oxidized semiconductor material from the silicon-on-insulator layer.

8. The semiconductor device structure of claim 7 further comprising:
a pad oxide layer on the first and second active regions.

9. The semiconductor device structure of claim 8 wherein the pad oxide layer has a thickness between approximately 2 nm and approximately 10 nm.

10. The semiconductor device structure of claim 7 further comprising:
a pad nitride layer on the first and second active regions.

11. The semiconductor device structure of claim 10 wherein the pad nitride layer has a thickness between approximately 10 nm and approximately 150 nm.

12. The semiconductor device structure of claim 7 wherein the liquid-phase deposited silicon dioxide has a density similar to thermally grown silicon dioxide.

* * * * *